United States Patent [19]

Ferrier et al.

[11] Patent Number: 5,843,517

[45] Date of Patent: Dec. 1, 1998

[54] COMPOSITION AND METHOD FOR SELECTIVE PLATING

[75] Inventors: Donald Ferrier; Donna Kologe, both of Thomaston; Gary B. Larson, Cheshire, all of Conn.

[73] Assignee: MacDermid, Incorporated, Waterbury, Conn.

[21] Appl. No.: 846,635

[22] Filed: Apr. 30, 1997

[51] Int. Cl.$^6$ ........................................................ B05D 5/12
[52] U.S. Cl. ........................... 427/98; 427/304; 427/437; 427/443.1; 427/301; 106/1.05; 106/1.11; 205/125; 205/163; 205/210
[58] Field of Search ............................. 427/98, 301, 304, 427/305, 437, 443.1; 106/1.05, 1.11, 1.21; 205/125, 126, 163, 167, 210

[56] References Cited

U.S. PATENT DOCUMENTS

| | | | |
|---|---|---|---|
| 3,900,614 | 8/1975 | Lando | 106/1.11 |
| 3,935,345 | 1/1976 | Lema | 427/328 |
| 4,153,746 | 5/1979 | Kilthau | 427/304 |
| 4,187,198 | 2/1980 | Zeblinsky | 106/1.11 |
| 4,668,348 | 5/1987 | Jones et al. | 204/34 |
| 4,933,010 | 6/1990 | Okabayashi | 106/1.11 |

*Primary Examiner*—Brian K. Talbot
*Attorney, Agent, or Firm*—John L. Cordani

[57] ABSTRACT

This invention proposes the use of an activator solution comprising precious metal ions and an oxidizing agent for the selective activation and plating of metallic surfaces. The invention is particularly useful in plating exposed copper surfaces on printed circuit boards without substantial extraneous plating on the soldermask surfaces.

13 Claims, No Drawings

COMPOSITION AND METHOD FOR SELECTIVE PLATING

FIELD OF INVENTION

This invention relates generally to a composition and method for activating surfaces for the autocatalytic deposition of metal deposits. The invention is particularly useful in selectively activating the copper surfaces of printed circuit boards for the reception of electroless nickel-phosphorus plating thereon.

BACKGROUND ART

The activation of various types of surfaces with solutions or colloids containing precious metals such as palladium, gold and silver has been known for quite some time. The most rudimentary activators consist essentially of precious metals, most predominantly palladium, in aqueous solutions. A typical activation composition of this type might consist of an aqueous solution of palladium chloride, sodium chloride, and hydrochloric acid. The surface to be activated was merely dipped into this activating composition, rinsed, then electrolessly plated. These type activation compositions are still in use today.

The next generation of activator systems consisted of two sequential steps. The first step consist of a solution of a Group IV metal ion reducing agent, such as stannous ion, which solution applied a film of this reducing metal ion to the surface to be activated. The second step consisted of an aqueous solution of a precious metal, most predominantly. Thus, the initial Group IV metal ion reducing agent reduced precious metal ions to their zero valence state on the surface. The surface was then electrolessly plated.

More recent advances in activation involve the combination of the two-step activating systems into a single step. These single step activators consist mainly of tin-palladium colloids. A recent improvement to these generic tin-palladium colloidal activators is described in U.S. Pat. No. 4,863,758, the teachings of which are incorporated herein by reference in their entirety.

Regardless of the exact nature of these prior art activators, they all share at least one characteristic in common in that they all activate a variety of surfaces indiscriminately. This is particularly true in the area of printed circuit boards. These activators are used extensively to activate both the metallic and the plastic (usually epoxy-glass) surfaces of printed circuit boards for subsequent electroless metal plating. These activator compositions activate both types of surfaces indiscriminately, however, in many cases this indiscriminate nature of activation causes difficulty and/or inefficiency in the manufacture of printed circuit boards. In particular, in some cases, it is desirable to activate the metallic surfaces (usually copper or nickel) on the printed circuit board, but not the plastic surfaces, thus enabling selective plating on the metallic surfaces as opposed to the plastic surfaces.

This is particularly true in the plating of exposed metallic areas of the circuits after a majority of the board surface has been covered by solder mask (for a discussion of solder-masks please see U.S. Pat. No. 5,296,334, Castaldi et al., the teachings of which are incorporated herein by reference in their entirety). Generally, at this point, the manufacture of the circuit board is almost complete. The circuits and through-holes, if any, have been defined and plated, and the board itself has been coated with a permanent layer of solder mask. The solder mask generally covers all areas of the board, except for the holes, vias, pads, tabs, lands, and other areas of connection (collectively "areas of connection"). These areas of connection are usually copper or nickel areas which are exposed in order for subsequent connections of the components to be made thereto. These copper areas of connection require further treatment to protect or enhance their solderability or their ability to make other types of connection in a reliable manner.

Several methods of treatment of these areas have been proposed. Some proposals involve coating or pre-coating these areas with solder as described in U.S. Pat. No. 5,160,579, the teachings of which are incorporated by reference herein in their entirety. Other proposals involve the treatment of these copper surfaces with various organic pre-fluxes or anti-corrosion agents as described in U.S. Pat. No. 5,173,130, the teachings of which are incorporated by reference herein in their entirety. By far, however, the most popular way of treating these areas of connection is by overplating the copper with a barrier layer usually consisting of a metal such as nickel, followed by a second overplating with a precious metal such as gold, palladium or rhodium ("nickel-gold process" generally). These processes are aptly explained in U.S. Pat. Nos. 4,940,181 and 5,235,139, the teachings of which are both incorporated herein by reference in their entirety.

One of the difficulties with nickel-gold processes is that the copper surfaces are not catalytic to the electroless nickel-phosphorous baths which are used. U.S. Pat. No. 5,235,139, the teachings of which are incorporated herein by reference in their entirety, teaches the use of a nickel-boron coating prior to the nickel-phosphorous coating in an attempt to make the surface catalytic to the nickel-phosphorous bath. This approach is widely used but improvements are still desirable since incomplete coverage is still sporadically and unpredictably observed in the absence of a separate activation step.

It should be pointed out that various palladium or precious metal activators will activate copper surfaces for the reception of electroless nickel-phosphorous, but they will also indiscriminately activate other areas of the board on which plating is not desirable in this application. The current invention then addresses this concern and proposes an activator which will selectively activate the copper surfaces and thereby minimize or eliminate extraneous plating. In addition, generally, as activators are used they tend to build in the concentration of the substrate metal (copper). This increase in concentration of the substrate metal ions in the activator solutions causes typical activator solutions to become less effective. The activator solution proposed here provides a wide operating window and does not become less effective as the concentration of the substrate metal ions builds in the proposed activator solution.

SUMMARY OF THE INVENTION

The current invention proposes a new composition and process for activating surfaces for the auto catalytic deposition of metal deposits. The invention further proposes a composition and process for selectively activating certain surfaces and not other surfaces. The invention is particularly useful in selectively activating the copper surfaces of printed circuit boards for the reception of electroless nickel-phosphorous plating or other hypophosphite reduced metal plating.

The activator solution proposed herein contemplates the use of relatively low concentrations of precious metal ions in aqueous acidic solution in combination with an oxidizing agent. The foregoing composition is capable of activating metallic surfaces, especially copper surfaces, for reception of electroless plating thereon, particularly with electroless nickel-phosphorous or other hypophosphite reduced electroless plating solutions. The use of the foregoing activation will activate the metallic surfaces without concurrent activation of plastic surfaces in proximity to said metallic surfaces, thereby selectively activating the metallic surfaces while eliminating or minimizing extraneous plating upon other surfaces, such as the plastic surfaces. Other independent advantages include lower cost due to the dramatically lower concentrations of precious metals, higher adhesion between the substrate metal (eg. copper) and the plated metal (eg. electroless nickel-phosphorous), and reduced attack on surrounding surfaces (eg. solder mask) due to the relatively mild nature of the activating solution.

DETAILED DESCRIPTION OF THE INVENTION

Proposed herein is an improved composition and process for activating metallic surfaces for reception of plating thereon, said composition comprising precious metal ions and an oxidizing agent in acidic aqueous solution. The method proposed comprises contacting a metallic surface, preferably a copper surface, with the foregoing activator solution and subsequently electrolessly plating the metallic surface, preferably with an electroless nickel-phosphorous plating solution or other hypophosphite reduced plating solution. The advantages achievable through the use of the foregoing process and composition include, the ability to selectively activate and plate metallic surfaces without the concurrent activation and plating of plastic surfaces in proximity to the metallic surface, lower cost and higher efficiency, higher adhesion between the substrate metal and the plated metal, and reduced attack on the surrounding surfaces.

The precious metals useful in the proposed activator solution may include a material selected from the group consisting of palladium, gold, silver, platinum, and combinations of the foregoing. Preferably the precious metals are introduced into the activator solution as salts such as chlorides or sulfates, preferably chlorides. The inventors have found both palladium chloride and ruthenium chloride particularly advantageous for use in the compositions of this invention. The concentration of precious metal ions in the activator solution may range from 0.5 mg/l to 2 grams per liter but is preferably in the range of 1.0 to 100 mg/l and most preferably from 5 to 25 mg/l. The foregoing concentration ranges relate to the concentration of the precious metal itself in the activator solution.

The oxidizing agent may be one or a combination of a variety of oxidizing agents capable of oxidizing the metallic substrate to be plated upon. Some preferred oxidizing agents include persulfates, such as sodium persulfate and peroxides, such as hydrogen peroxide. The concentration of the oxidizing agent in the activating solution can be between 1 and 300 grams per liter, preferably it is between 5 and 100 grams per liter and most preferably it is between 10 and 50 grams per liter. The most appropriate concentration of oxidizing agent in the activating solution depends in large part upon the type of oxidizing agent employed and the metallic substrate being plated. In particular, when sodium persulfate is utilized as the oxidizing agent and copper is the metallic substrate, then the inventors have found that a concentration of sodium persulfate of from 25 to 50 grams per liter is very effective.

The activating solution is preferably acidic in nature. The inventors have found that it is advantageous to add from 0.5 to 500 grams of acid per liter to the activating solution. The inventors have found that a variety of mineral acids are advantageous in this regard, including sulfuric acid and hydrochloric acid. The inventors have found that the addition of from 10 to 50 grams per liter of sulfuric acid to the activating solution is most effective.

The following represents a typical activating composition useful in the practice of the invention proposed herein:

sodium persulfate: 35 grams per liter sulfuric acid: 40 grams per liter palladium chloride: 2 milligrams per liter as palladium balance: water The foregoing composition is preferably made by adding the sulfuric acid to the water with subsequent sequential additions of sodium persulfate and palladium chloride.

The activating composition is advantageously utilized in the following process:

1. clean the metallic substrate to be plated;
2. rinse;
3. contact the metallic substrate with the activating composition;
4. rinse; and
5. plate, preferably with electroless nickel-phosphorous or other hypophosphite reduced metal plating solution.

The cleaning step and the subsequent rinse are optional but preferred. Any typical cleaning solution may be utilized. The inventors have found that acidic cleaning solutions work acceptably and do not interfere with the subsequent activating solution.

The metallic substrate may be contacted with the activating solution in several ways including by immersion or spray. Since the activating solution is acidic and also contains the oxidizing agent it will simultaneously activate and etch the metallic substrate. The temperature of the activating solution can range from 10°–60° C. but is preferably between 20°–40° C. The contact time depends upon the method of contact, but the inventors have found contact times of from 1 to 5 minutes useful when the method of contact is immersion.

The activator solutions of the present invention as discussed are useful in activating a variety of metallic surfaces for plating thereon without concurrently activating various plastic surfaces in proximity to the metallic surfaces. Thus the activator solutions are capable of activating a variety of metallic surfaces including copper, nickel, steel, and alloys of the foregoing metals. In addition the activator solutions will not activate various plastic surfaces in proximity to the such metallic surfaces, said plastic surfaces including epoxy, epoxy-glass, epoxy-novolac, polyimide, polyetherimides, polyacrylates, phenolics, and copolymers or blends of the foregoing resins. In particular the activator solutions will not activate soldermask surfaces in proximity to metallic surfaces during the fabrication of printed circuit boards.

A variety of plating solutions may be utilized subsequent to the application of the activator solution. These plating solutions may include electroless nickel-phosphorous, electroless nickel-boron, electroless cobalt-phosphorous, electroless cobalt-boron, electroless copper, and electroless palladium. Thus the activator solutions of the current invention are useful in activating metallic surfaces (such as those recited in the previous paragraph) to be plated with various plating solutions (such as those given above) without concurrent activation of plastic surfaces (such as those recited in the previous paragraph) in proximity to the metallic surfaces.

The composition and process proposed are particularly useful in the production of printed circuits. Once the holes, circuits, and other features of a printed circuit board have been formed and plated through a variety of well-known techniques, the surfaces of the board are frequently coated with a permanent soldermask. The soldermask generally covers all areas of the board except for the areas of connection. These areas of connection are, at this stage, exposed copper surfaces. As part of the invention, the following process is proposed for the selective activation of those surfaces.

1. The printed circuit board with surfaces consisting essentially of soldermask and exposed copper areas is subjected to a chemical cleaner such as MacDermid Planar Acid Cleaner XD-6255-T.
2. The board is then activated in an activator solution comprising a precious metal and an oxidizing agent.
3. The board is then subjected to a plating solution such as MacDermid Planar Electroless Nickel XD-6263-T.
4. The board is finally subjected to a precious metal plating solution such as an electroless gold or palladium plating solution.

Note that clean water rinses are interposed between these chemical operations.

The invention is further described for illustrative purposes only (in no way limiting) in the following specific examples:

EXAMPLE I

An aqueous solution of 30 gr/l of sulfuric acid and 50 gr/l sodium persulfate, was made up. To that solution was added 2 mg/l palladium ion in the form of palladium chloride in dilute hydrochloric acid. The temperature of the solution was set to 30° C. An epoxy-glass based circuit board patterned with soldermask (MacDermid 6000 soldermask which is an epoxy-acrylate copolymer) and having exposed pads, some with associated holes and some without associated holes, was run through the following cycle:

|  | Time | Temp |
|---|---|---|
| 1. MacDermid Planar Acid Cleaner XD-6255-T | 5 min | 120° F. |
| 2. Cold water rinse | 2 min | 60° F. |
| 3. Activator solution as prepared | 5 min | 130° F. |
| 4. Cold water rinse | 2 min | 60° F. |
| 5. MacDermid Planar Electroless Nickel XD-6263-T | 15 min | 190° F. |
| 6. Cold water rinse | 2 min | 60° F. |
| 7. Dry | | |

Inspection of the panel indicated complete coverage of the exposed copper by the electroless nickel-phosphorous, with no evidence of extraneous plating on soldermask areas.

COMPARATIVE EXAMPLE 1

A patterned circuit board with soldermask, as above, was run through the cycle of Example 1 except that the activator solution was the following:

A solution of 10 gr/l sodium glycolate was adjusted to pH 3.0 with concentrated sulfuric acid and 10 gr/l sodium chloride was dissolved in this solution. 500 mg/l palladium ion was added as a solution of palladium chloride in dilute hydrochloric acid. The temperature was set to 92° F.

After plating in the electroless nickel, the copper surfaces were completely covered but massive overplating of the soldermask surface had occurred.

EXAMPLE 2

A polyimide based circuit board with soldermask was run as in Example I except that the exposed pads, holes, lands and circuits were nickel instead of copper and the plating solution was MacDermid M-89 Electroless Copper instead of MacDermid Planar Electroless Nickel XD-6263-T. Coverage of the exposed nickel surfaces with the electroless copper was complete and no extraneous plating was observed on the solder mask or on the polyimide.

EXAMPLE 3

An epoxy-glass based circuit board with soldermask was run as in Example I except that the exposed pads, holes, lands and circuits were nickel instead of copper and the plating solution was MacDermid Electroless Palladium instead of MacDermid Planar Electroless Nickel XD-6263-T. Coverage of the exposed nickel surfaces with the electroless palladium was complete and no extraneous plating was observed on the solder mask or on the epoxy-glass.

EXAMPLE 4

Solutions of sodium persulfate, 25 g/L, in 2% by volume sulfuric acid were made up with the following palladium ion concentrations: 2 mg/L; 10 mg/L; 20 mg/L; 50 mg/L and 100 mg/L. The solutions were heated to 90° F. Panels with clean copper surface pads and traces were immersed in these solutions for two minutes, rinsed for one minute and immersed in a MacDermid 105 electroless nickel at 190° F. for 20 minutes. After plating the panels were inspected for coverage and overplate on the laminate surface, and solder shocked five times at 550° F. to determine adhesion of the plated deposit to the copper surface. The panel activated in the solution containing 2 mg/L palladium initiated only 80% in the electroless nickel solution; the remaining panels initiated completely. No overplate was observed on any of these panels. After solder shocking, separation of the nickel deposit from the copper surface was observed on the panels treated with the etch solutions containing 50 mg/L and 100 mg/L palladium.

COMPARATIVE EXAMPLE 2

Solutions of approximately 2N hydrochloric acid were made up with the following concentrations of palladium ion: 1 mg/L, 5 mg/L, 10 mg/L, 20 mg/L, 50 mg/L and 100 mg/L. The solutions were heated to 90° F. Panels with copper pads and traces were treated with these palladium solutions as above and plated in the MacDermid 105 electroless nickel at 190° F. for twenty minutes, then inspected for coverage and overplate. Coverage was good on all the panels; however, severe overplate was observed on the panels treated with the solutions containing 20 mg/L, 50 mg/L and 100 mg/L palladium ion concentrations.

EXAMPLE 5

The following solutions were made up: 3% by volume sulfuric acid with palladium ion concentrations (from palladium chloride stock solution) of 1 mg/L, 5 mg/L and 10 mg/L; and 3% by volume sulfuric acid with 3% by volume hydrogen peroxide concentrate with palladium ion concentrations (from palladium chloride stock solution) of 1 mg/L, 5 mg/L and 10 mg/L. The six solutions were heated to 90° F. and panels with surface copper features consisting of 1/16th inch copper squares surrounded by 1/16th inch unclad areas were immersed for two minutes and rinsed. The panels were plated for twenty minutes in MacDermid 105 electroless nickel at 190° F., then inspected for coverage and overplate. Results on the panels treated with the palladium solutions not containing peroxide were approximately 50% coverage on the panel treated at 1 mg/L palladium ion and complete coverage on the panels treated with the 5 mg/L and 10 mg/L palladium ion concentrations. Results on the panels treated with the palladium solutions containing peroxide were: no coverage on the panel treated at 1 mg/L palladium ion and complete coverage on the panels treated with the 5 mg/L and 10 mg/L palladium ion concentrations. No overplate was observed on any panel.

Five grams per liter copper ion as copper sulfate pentahydrate was then added to each palladium solution and the experiment was repeated. The results were as follows: of the panels treated with the palladium solutions not containing peroxide, the 1 mg/L palladium activator gave approximately 95% coverage on one side and 5% coverage on the other, with no overplate; the 5 mg/L palladium activator gave 100% coverage on one side and approximately 90% coverage on the other side, with slight overplate; and the 10 mg/L palladium activator gave 100% coverage with significant overplate. Of the panels treated with the palladium solutions containing peroxide, the 1 mg/L palladium activator have 100% coverage on one side and approximately 10% coverage on the other side, while the 5 mg/L and 10 mg/L palladium activators gave full coverage. Additionally, there was no overplate observed on the panels treated with the activators containing hydrogen peroxide.

EXAMPLE 6

An etch solution was made up of: 2% by volume sulfuric acid, 10 grams per liter ferric sulfate and 5 mg per liter palladium ion. Immersion of a panel with copper pads and traces in this solution for thirty seconds, followed by rinsing and electroless nickel plating gave good coverage and adhesion of the nickel plate, with no overplate.

EXAMPLE 7

An etch solution of 10 grams per liter ferric sulfate, 10 grams per liter sodium bisulfate and 4 mg per liter palladium ion was made up. Immersion of a panel with copper pads and traces in this solution for thirty seconds, followed by rinsing and electroless nickel plating gave good coverage and adhesion of the nickel plate, with no overplate.

We claim:

1. A process for the activation of metallic surfaces for the reception of plating thereupon, said process comprising contacting the metallic surfaces with an activator solution, said activator solution comprising precious metal ions and an oxidizing agent, which oxidizing agent is selected from the group consisting of persulfates, peroxides and mixtures thereof wherein the metallic surfaces are in proximity to plastic surfaces and wherein both the metallic surfaces and the plastic surfaces are contacted with the activator solution but only the metallic surfaces are effectively activated for the reception of plating thereupon.

2. A process according to claim 1 wherein the activator solution is acidic.

3. A process according to claim 2 wherein the precious metal ions are present in the activator solution at a concentration of from 5.0 mg/l to 25 mg/l.

4. A process according to claim 2 wherein the activator solution contains from 0.5 to 500 grams per liter of an acid selected from the group consisting of hydrochloric acid, sulfuric acid and mixtures thereof.

5. A process according to claim 1 wherein the precious metal ions are present in the activator solution at a concentration of from 5.0 mg/l to 25 mg/l.

6. A process according to claim 1 wherein the activator solution contains from 0.5 to 500 grams per liter of an acid selected from the group consisting of hydrochloric acid, sulfuric acid and mixtures thereof.

7. A process according to claim 3 wherein the precious metal ions are selected from the group consisting of palladium, gold, platinum, silver and combinations thereof.

8. A process according to claim 5 wherein the precious metal ions are selected from the group consisting of palladium, gold, platinum, silver and combinations thereof.

9. A process for the preparation of printed circuit boards, said printed circuit boards comprising metallic and plastic surfaces, said process comprising:
   a). contacting the printed circuit board with an activator solution comprising precious metal ions and an oxidizing agent; and
   b). subsequently contacting the printed circuit board with an electroless plating solution, wherein plating occurs on the metallic surfaces and substantially no plating occurs on the plastic surfaces; and wherein the oxidizing agent is selected from the group consisting of persulfates, peroxides and mixtures thereof.

10. A process according to claim 9 wherein the activator solution is acidic.

11. A process according to claim 10 wherein the precious metal ions are present in the activator solution at a concentration of from 0.5 mg/l to 100 mg/l.

12. A process according to claim 9 wherein the electroless plating solution is selected from the group consisting of electroless nickel-phosphorous plating solution, electroless cobalt-phosphorous plating solution, electroless nickel-boron plating solution, electroless cobalt-boron plating solution, electroless copper plating solution, and electroless palladium plating solution.

13. A process according to claim 11 wherein the precious metal ions are selected from the group consisting of palladium, gold, platinum, silver and combinations thereof.

* * * * *